(12) United States Patent
Chew

(10) Patent No.: US 9,236,537 B2
(45) Date of Patent: Jan. 12, 2016

(54) SEMICONDUCTOR LIGHT EMITTING DEVICE

(71) Applicant: Avago Technologies General IP (Singapore) Pte. Ltd., Singapore (SG)

(72) Inventor: Tong Fatt Chew, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/295,064

(22) Filed: Jun. 3, 2014

(65) Prior Publication Data

US 2014/0264399 A1 Sep. 18, 2014

Related U.S. Application Data

(62) Division of application No. 12/142,757, filed on Jun. 19, 2008, now Pat. No. 8,778,705, which is a division of application No. 11/068,645, filed on Feb. 22, 2005, now Pat. No. 7,405,433.

(51) Int. Cl.

| H01L 29/22 | (2006.01) |
|---|---|
| H01L 33/52 | (2010.01) |
| B29C 33/00 | (2006.01) |
| B29C 39/00 | (2006.01) |

(Continued)

(52) U.S. Cl.
CPC ............ *H01L 33/52* (2013.01); *B29C 33/0016* (2013.01); *B29C 39/006* (2013.01); *H01L 24/97* (2013.01); *H01L 25/0753* (2013.01); *H01L 33/50* (2013.01); *H01L 33/56* (2013.01); *H01L 33/60* (2013.01); *B29C 35/02* (2013.01); *B29K 2021/00* (2013.01); *B29K 2995/0018* (2013.01); *B29L 2011/00* (2013.01); *H01L 2224/48091* (2013.01); *H01L 2224/48247* (2013.01); *H01L 2924/12041* (2013.01); *H01L 2924/15787* (2013.01); *H01L 2924/351* (2013.01)

(58) Field of Classification Search
CPC ..... H01L 24/97; H01L 25/0753; H01L 33/50; H01L 33/52; H01L 33/56; H01L 33/60; H01L 2224/48091; H01L 2224/48247; H01L 2924/12041; H01L 2924/15787; H01L 2924/351
USPC .............................................. 257/81, 98–100
See application file for complete search history.

(56) References Cited

U.S. PATENT DOCUMENTS

| 4,478,588 A | 10/1984 | Lockard |
|---|---|---|
| 6,204,523 B1 | 3/2001 | Carey et al. |

(Continued)

FOREIGN PATENT DOCUMENTS

| DE | 3019239 | 11/1981 |
|---|---|---|
| DE | 19638667 | 4/1998 |

(Continued)

OTHER PUBLICATIONS

German Office Action dated Mar. 19, 2007 involving counterpart German application No. 10 2005 052 730.2-33.

(Continued)

*Primary Examiner* — Thanh T Nguyen

(57) ABSTRACT

A light-emitting diode ("LED") device has an LED chip attached to a substrate. The terminals of the LED chip are electrically coupled to leads of the LED device. Elastomeric encapsulant within a receptacle of the LED device surrounds the LED chip. A second encapsulant is disposed within an aperture of the receptacle on the elastomeric encapsulant.

20 Claims, 6 Drawing Sheets

(51) Int. Cl.
*H01L 33/56* (2010.01)
*H01L 23/00* (2006.01)
*H01L 25/075* (2006.01)
*H01L 33/50* (2010.01)
*H01L 33/60* (2010.01)
*B29C 35/02* (2006.01)
*B29K 21/00* (2006.01)
*B29L 11/00* (2006.01)

(56) References Cited

U.S. PATENT DOCUMENTS

| | | | |
|---|---|---|---|
| 6,274,924 B1 | 8/2001 | Carey et al. | |
| 6,480,389 B1 | 11/2002 | Shie et al. | |
| 6,518,600 B1 * | 2/2003 | Shaddock | 257/98 |
| 6,521,914 B2 | 2/2003 | Krames et al. | |
| 6,590,235 B2 | 7/2003 | Carey et al. | |
| 6,642,652 B2 | 11/2003 | Collins, III et al. | |
| 6,646,292 B2 | 11/2003 | Steigerwald et al. | |
| 6,806,583 B2 | 10/2004 | Yoganandan et al. | |
| 8,778,705 B2 | 7/2014 | Chew | |
| 2001/0026011 A1 * | 10/2001 | Roberts et al. | 257/678 |
| 2004/0198924 A1 | 10/2004 | Young et al. | |
| 2007/0085107 A1 | 4/2007 | Nitta et al. | |

FOREIGN PATENT DOCUMENTS

| | | |
|---|---|---|
| EP | 0658933 | 6/1995 |
| GB | 2343549 | 5/2000 |
| JP | 52-157764 | 11/1977 |
| JP | 54-19660 | 2/1979 |
| JP | 8-335720 | 12/1996 |
| JP | 2002-198570 | 7/2002 |
| JP | 2002-314142 | 10/2002 |
| JP | 2004-235337 | 8/2004 |
| TW | 515062 | 12/2002 |
| TW | 200421683 | 10/2004 |
| TW | 200505050 | 2/2005 |

OTHER PUBLICATIONS

English translation of German Office Action dated Mar. 19, 2007 involving counterpart German application No. 10 2005 052 730.2-33.
Official Action for U.S. Appl. No. 12/142,757, mailed Aug. 13, 2009.
Official Action for U.S. Appl. No. 12/142,757, mailed Mar. 17, 2010.
Official Action for U.S. Appl. No. 12/142,757, mailed Jun. 3, 2010.
Notice of Allowance for U.S. Appl. No. 12/142,757, mailed Feb. 28, 2014.

* cited by examiner

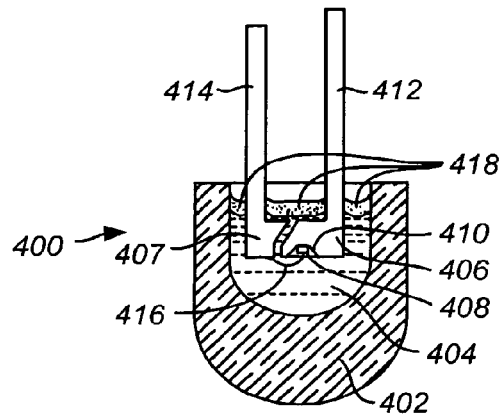
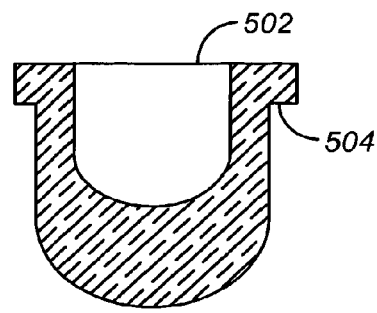
FIG. 4    FIG. 5A
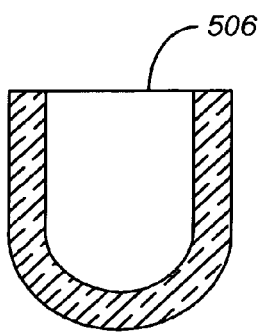
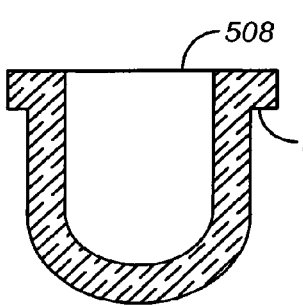
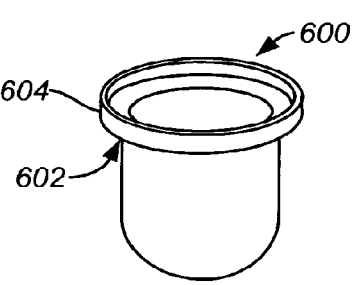
FIG. 5B    FIG. 5C    FIG. 6A
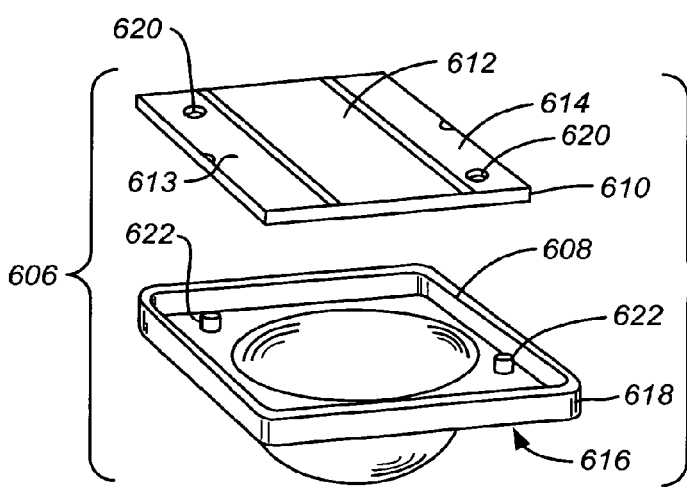
FIG. 6B

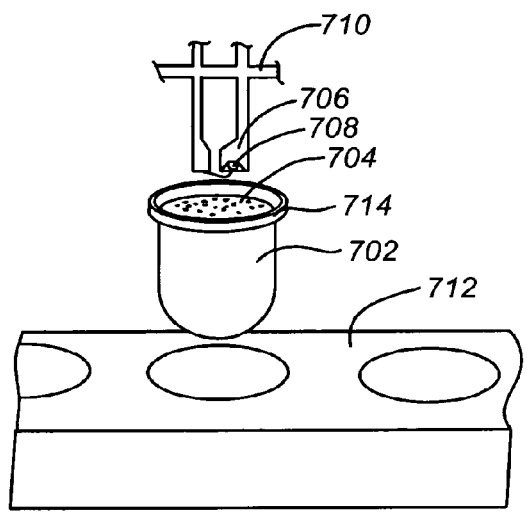
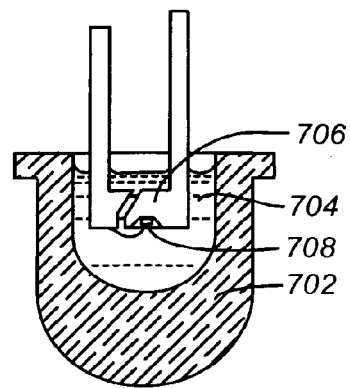
FIG. 7A
FIG. 7B
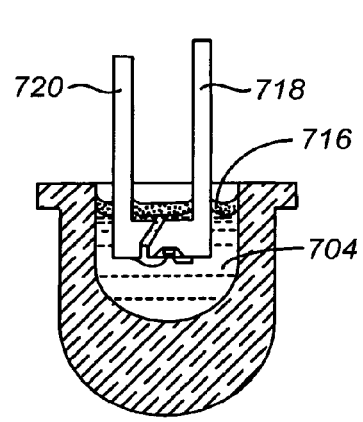
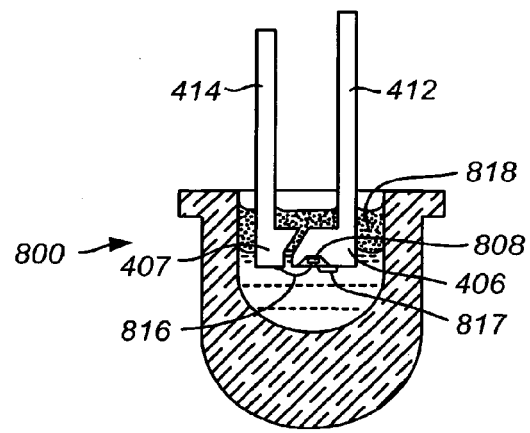
FIG. 7C
FIG. 8

SEMICONDUCTOR LIGHT EMITTING DEVICE

CROSS-REFERENCE TO RELATED APPLICATIONS

This application is a division of U.S. patent application Ser. No. 12/142,757, filed Jun. 19, 2008, which is a division of U.S. patent application Ser. No. 11/068,645, filed Feb. 22, 2005, the entire disclosures of which are hereby incorporated herein by reference.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

A conventional light emitting diode ("LED") device uses an epoxy as encapsulating material. The encapsulation process is frequently accomplished by injection molding, transfer molding or casting. Cured epoxy encapsulant has relatively high hardness, which provides resistance to scratches and abrasion, high rigidity, and high initial light transmissivity. Conventional encapsulated LED devices come in a variety of sizes and styles, such as 4 mm Oval LED Lamps, 5 mm Round LED Lamps, Chip LEDs and plastic leaded chip carriers ("PLCCs").

However epoxy-based encapsulating materials suffer from thermal and photo degradation. Degradation is especially acute if the wavelength emitted by the LED chip is in the near the ultraviolet ("UV") portion of the spectrum. Epoxy encapsulating material degrades when subjected to high light flux, particularly if the wavelength of the light is in the range from 200 nm to 570 nm. Degradation of the encapsulant results in increased absorption of light in the blue to green wavelengths, causing a "yellowing" effect on clear epoxy encapsulant and reduced light transmissivity through the encapsulant, which causes a significant drop in the light output of the LED device. Typically, an epoxy-based 5 mm LED lamp device's light output drops by 20% or more after 1000 hours in use, and by 50% or more after 10,000 hours in use.

FIG. 1A shows a portion of a strip 100 of semi-finished conventional LED lamps 102, 104. The LED lamps 102, 104 are attached to a leadframe 106, which is fabricated as a strip of LED lamps. LED lamps are singulated from the leadframe 106 by shearing leads 108, 110. "Singulation" means separating an LED lamp or a group of associated LED lamps from a leadframe or other substrate, such as a ceramic substrate or a printed circuit board ("PCB") substrate.

An LED chip 114 is attached to a first substrate portion 115 that electrically couples a first terminal (not shown) of the LED chip 114 to the lead 110. In a particular embodiment, the LED chip is mounted in a reflector cup of the first substrate portion using conductive epoxy. A bond wire 112 electrically couples a second terminal (not shown) of the LED chip 114 to a second substrate portion 117. The bond wire 112, LED chip 114, first substrate portion 115, second substrate portion 117, and portions of the leads 108, 110 are encapsulated in hard, rigid encapsulant 116, such as an epoxy encapsulant. The hard, rigid encapsulant 116 protects the bond wire from being damaged when an LED lamp is sheared from the leadframe 106 by securing the first and second substrate portions so that the do not move relative to each other.

FIG. 1B shows a conventional singulated LED lamp 102. The leads 108, 110 have been cut from the lead frame (see FIG. 1A, ref. num. 106, 108, 110). One lead 108 has been cut shorter than the other lead 110 to indicate the electrical polarity of the LED chip 114. Hard, rigid encapsulant 116 secures one lead relative to the other to prevent avoid damage to the bond wire 112.

FIG. 1C shows a conventional singulated LED lamp 102 inserted and clinched into a PCB 120. In a typical automated assembly process, the leads 108, 110 of the LED lamp 102 are inserted through holes in the PCB 120 and bent to secure the LED lamp 102 in place for a subsequent soldering step. The strong, rigid epoxy encapsulant secures the leads 108, 110 from movement relative to each other, which could otherwise damage the LED chip 114 and/or the bond wire 112.

FIG. 2 shows a prior-art light source 200. An LED chip 214 is attached to a PCB substrate 201. Bond wires 212, 213 electrically couple terminals (not shown) on the LED chip 214 to terminals 208, 210 on the PCB substrate 201. The terminals 208, 210 are plated through holes that allow surface mounting of the light source 200 on a surface-mount circuit substrate. The plated through holes are plugged with a compound 211, such as solder resist, before encapsulant 216 shaped as a dome is molded over the LED chip 214 and top of the PCB substrate 201. More information on such a light source is found in U.S. Pat. No. 6,806,583.

FIG. 3 is a simplified cut-away isometric view of another prior art LED device 300. An LED chip 314 is attached to a silicon substrate member 301 (forming what is commonly known as a "chip-on-chip" assembly), which is attached to a substrate member 303. In a particular embodiment, the LED chip 314 is a high-power LED chip, that is, an LED chip operating at or above 500 mW, and the substrate member 303 is metal (e.g. a metal "slug") that provides a heat sink to conduct heat away from the LED chip 314 through the silicon substrate member 301. A lead 308 extends from a lead support member 309, which is typically a molded polymer. A second lead is not shown in this view, but essentially extends from the lead support member opposite the lead 308.

A pre-molded thermoplastic cover 316 fits over the LED chip 314 to form a cavity 315 within the LED device 300. The cover 316 is shaped to form a lens according to the desired light intensity distribution pattern of the LED device 300. The cover forms a cavity 315 in which the LED chip 314 sits. Subsequently liquid silicone encapsulant is introduced into the cavity by dispensing or injecting it through an opening in the package to fill the entire space in the cavity 315 within the package, and the encapsulating material is then cured. The silicone filling the cavity 315 provides a soft, optically transparent material having a refractive index greater than 1.3.

Using silicone materials with high-power LED chips, particularly those operating in the blue to green portion of the spectrum, is desirable because silicone is less prone to yellowing than the epoxy used in LED lamps such as the LED lamp 102 shown in FIG. 1B. However, the packaging techniques used in the LED device 300 of FIG. 3 are relatively elaborate, involving many parts and assembly steps.

Hence, there is a need for LED devices that do not degrade like conventional LED lamps, yet do not require the number of components and assembly steps typically used to package high-power LED chips.

BRIEF SUMMARY OF THE INVENTION

A light-emitting diode ("LED") device has an LED chip attached to a substrate. The terminals of the LED chip are electrically coupled to leads of the LED device. Elastomeric encapsulant within a receptacle of the LED device surrounds the LED chip. A second encapsulant is disposed within an aperture of the receptacle on the elastomeric encapsulant.

BRIEF DESCRIPTION OF THE DRAWINGS

FIG. 4 shows a simplified cross section of an LED device ("lamp") according to an embodiment of the invention.

FIGS. 5A-5C show alternative receptacles according to embodiments of the invention.

FIG. 6A is an isometric view of a receptacle having a round flange and a round rim according to an embodiment of the invention.

FIG. 6B is an isometric exploded view of a receptacle having a square flange and square rim according to an embodiment of the invention.

FIGS. 7A-7C show cross sections of portions of LED lamps to illustrate a manufacturing sequence according to an embodiment of the invention.

FIG. 8 is a cross section of an LED lamp according to another embodiment of the invention.

DETAILED DESCRIPTION OF THE EMBODIMENTS

Silicone elastomers offer desirable characteristics as an encapsulation material. Silicone elastomers offer high thermal stability, low photo-degradation, low light loss transmission characteristics, a wide range of refractive indices, low stress after encapsulation cure, and low cost. They are non-toxic and are not sensitive to high humidity high temperature environments. Silicone encapsulants are particularly desirable for use with light emissions with a wavelength ranging from 200 nm to 570 nm because of the low transmission loss, and more particularly when used in high-temperature operations (i.e. up to 100° C.).

However, a cured silicone encapsulant typically has a hardness of less than Durometer Shore 70A. The silicone polymer may be liquid, gelatinous or in solid state under various stages of manufacturing. However the low hardness of silicone polymer has the disadvantages of low resistance to scratches, abrasion and wear. Furthermore, packages formed from silicon polymer do not have high rigidity and do not provide good dimensional stability when subject to mechanical handling, thus reducing its ease of assembly and limiting the scope of its use in various preferred LED package outline designs.

Figure 1A:
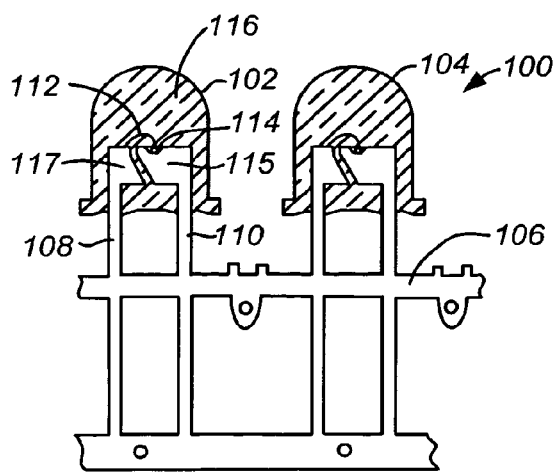
FIG. 1A shows a portion of a strip of semi-finished conventional LED lamps.
Figure 1B:
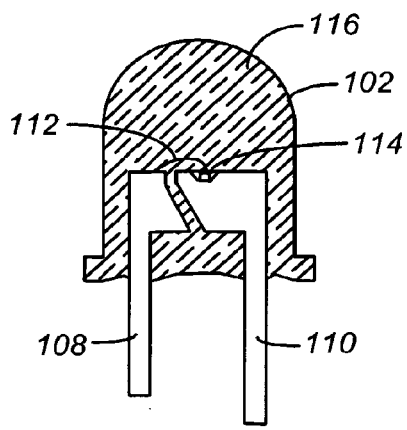
FIG. 1B shows a singulated conventional LED lamp.
Figure 1C:
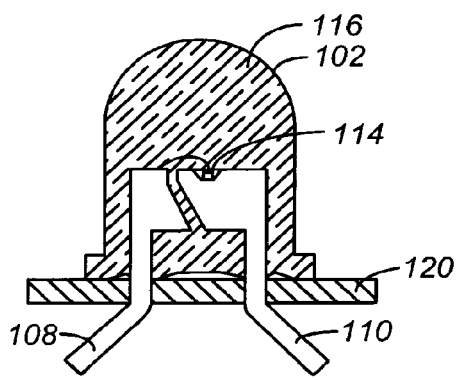
FIG. 1C shows a conventional singulated LED lamp inserted and clinched into a PCB.
Figure 2:
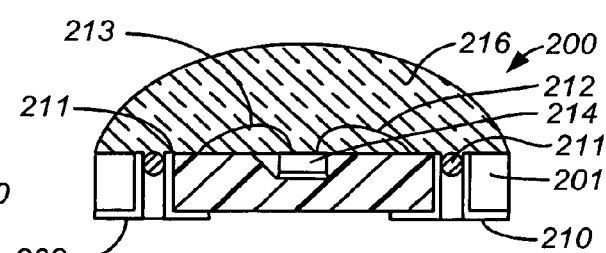
FIG. 2 shows a prior-art light source.
Figure 3:
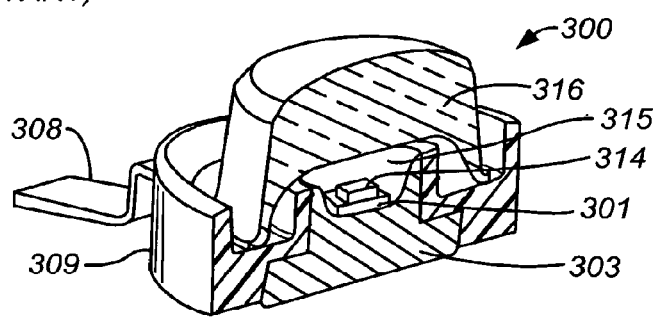
FIG. 3 is a simplified cut-away isometric view of another prior art LED device.

If the epoxy encapsulant 116 of the LED lamp 102 shown in FIG. 1A were replaced with a silicone encapsulant, the leads 108, 110 and first and second substrate portions 115, 117 would not be held sufficiently rigid to avoid damaging the wire bond when the LED lamp is singulated from the lead frame, or when the leads are bent after insertion through a PCB (see FIG. 1C). The exterior surface of the LED lamp having the silicone encapsulant would also be more prone to scratches, wear, and abrasion that degrade optical performance. Thus, a reliable LED lamp similar to the prior art device of FIG. 1B is not obtained by using silicone for the encapsulant due to the low hardness and low rigidity of typical silicone materials.

Another problem arises if the epoxy encapsulant is replaced with a silicone-type encapsulant in an LED lamp using a silicone-phosphor wavelength-converting layer. The relatively weaker adhesion strength of the silicone-phosphor coating to the LED chip compared to the adhesion strength between the silicone-phosphor coating and the epoxy encapsulant causes the silicone-phosphor layer to de-laminate from the surface of the LED chip.

Silicones typically generate less compressive or tensile stresses on the LED chip in a package after curing compared to harder-cured polymers. The reduced stress on the LED chip enables a more reliable and longer-lived LED device. Silicone is known to be especially desirable for use with LED chips that have a thin, uniform layer of wavelength-converting material (e.g. phosphor particles and/or quantum dot particles dispersed in a silicone matrix). Small particles of silica are optionally added as a diffusant. Such "phosphor layers" are typically less than about 10% of the thickness of the LED structure, and enable light emitted from the LED chip to traverse through a uniform path length resulting in a uniform proportion of light being converted in the phosphor layer. This results in a uniform color output from the LED device with respect to the spatial distribution of light. The silicone-silicone interface between the phosphor layer and silicone encapsulant is known to be minimally affected by chemical incompatibility and by mechanical incompatibility during thermal excursion.

FIG. 4 shows a simplified cross section of an LED device ("lamp") 400 according to an embodiment of the invention. The LED lamp 400 is round when viewed on end, and has a receptacle 402, which is usually transparent, but alternatively is diffusive, with high hardness, high rigidity and high light transmissivity, an elastomeric encapsulant 404 disposed in the receptacle 402. The receptacle 402 may be formed by injection molding or transfer molding, for example, with the material used being of substantially transparent material of high rigidity, and high scratch resistance, for example, but not limited to, materials such as polycarbonate, cyclic olefin polymers or copolymers, polyamides, polymethylacrylates ("PMMAs"), liquid crystal polymers ("LCP"), epoxies and polysulfones. As used herein, "transparent" means clear or tinted. In some embodiments, the LED chip emits a wavelength between about 200 nm and about 700 nm.

An LED chip 408 is mechanically attached to a first substrate portion 406 in an optional reflector cup 410. A first terminal (not shown) of the LED chip is electrically coupled to the first substrate portion 406 with conductive adhesive. A second terminal (not shown) of the LED chip is electrically coupled to a second substrate portion 407 with a bond wire 416. Elastomeric encapsulant 404 is dispensed into the receptacle 402, and the LED chip 408, first and second substrate portions 406, 407, and bond wire 416 are inserted into the elastomeric encapsulant 404, which is then cured.

The receptacle 402 functions as a mold-cup that forms part of the finished LED lamp 400. The receptacle 402 becomes part of the finished LED lamp 400, thus avoiding de-lamination problems that can arise when elastomeric encapsulant is removed from a mold. Suitable elastomeric encapsulants include silicones, fluorosilicones, perfluoropolymers, and amphorous fluoroplastics. Suitable encapsulants include encapsulants described in U.S. Patent Application Publication No. US 20040198924 A1, entitled "Optically clear high temperature resistant silicone polymers of high refractive index," by Young et al., and are available from NuSil Technology of Carpenteria, Calif.

A first lead 412, which was formerly part of a metal leadframe strip, extends away from the first substrate portion 406. A second lead 414, which was also formerly part of the metal leadframe strip, extends away from the second substrate portion 407.

The receptacle 402 has a substantially non-uniform thickness that forms a lens for directing light from the LED chip 408. Another lens is formed by the elastomeric encapsulant 404 according to the inside curvature of the receptacle 402. The combination of the lens formed by the receptacle and the lens formed by the elastomeric encapsulant is particularly desirable to obtain light distribution patterns that are not achieved with conventional LED encapsulants (e.g. ref. num. 116, FIG. 1A). In a particular embodiment, the elastomeric encapsulant and the material of the receptacle are selected such that the index of refraction of the elastomeric encapsulant material is greater than the index of refraction of the receptacle material to minimize Fresnel light transmission losses. The higher index of refraction for the elastomeric encapsulant material provides improved efficiency.

After the elastomeric encapsulant 404 has been cured, a second encapsulant 418 is backfilled over the elastomeric encapsulant 404. The second encapsulant is rigid after curing, and in a particular embodiment has a Shore Hardness greater than D70, which is desirable to secure the leads during singulation and during assembly of the LED lamp into a circuit. The backfilling is done by dispensing uncured second encapsulant in a liquid or a gel state. After curing, the second encapsulant 418 forms a thermally conductive, hard, rigid layer on top of the elastomeric encapsulant 404, sealing the LED chip 408 and the elastomeric encapsulant 404 within the receptacle 402. In a particular embodiment, the second encapsulant 418 includes thermally conductive filler, such as ceramic (e.g. silicon-aluminum oxide) powder, dispersed in an epoxy matrix. In a particular embodiment, the second encapsulating material has a thermal conductivity greater than 0.5 Wm° K.

The second encapsulant 418 layer provides a stronger, more rigid base for the leads 412, 414, reducing potential damage to the LED chip 408 and bond wire 416 during singulation, handling, and assembly operations. The second encapsulant 418 also assists in dissipating heat generated by the LED chip 408 during operations by conducting heat away from the substrate 406, both along the leads 412, 414, as well as to the receptacle 402.

FIGS. 5A-5C show alternative receptacles according to embodiments of the invention. FIG. 5A shows a cross section of a receptacle 502 similar to the receptacle 402 of FIG. 4, with the addition of a flange 504. The flange facilitates manufacturability and assembly of an LED lamp by a user in some applications. FIG. 5B shows a cross section of a receptacle 506 with a substantially uniform wall thickness, according to another embodiment of the invention. FIG. 5C shows a cross section of a receptacle 508 with a substantially uniform wall thickness having a flange 510. Alternative embodiments use other shapes. In particular embodiments, the wall thickness of a receptacle is chosen so as to provide, when filled with elastomeric encapsulant, a desired spatial distribution of light intensity from an LED device.

FIG. 6A is an isometric view of a receptacle 600 having a round flange 602 and a round rim 604 according to an embodiment of the invention. A rim is useful when an LED lamp is inserted through a PCB to limit the height of the LED lamp. FIG. 6B is an exploded isometric view of an LED lamp 606 with a receptacle 608 and a substrate 610. In a particular embodiment, the substrate 610 is PCB substrate that has cathode electrical contact pad 613, a center pad 612, which serves as a heat sink pad in some embodiments and as a second cathode pad in alternative embodiments, and an anode electrical contact pad 614 on the back side of the substrate 610. An LED chip (not shown) is mounted in a reflector cup on the opposite side of the substrate 610 and is electrically coupled to the contact pads. The receptacle 608 has a square flange 616 and a square rim 618.

Alignment holes 620 in the substrate 610 cooperate with alignment pins 622 on the receptacle 608 to align the substrate, and hence the LED chip (not shown) to the receptacle. Elastomeric encapsulant (not shown) is dispensed into a mold cup 624 of the receptacle 608, the substrate 610 is assembled with the receptacle 608, and the elasotmeric encapsulant is cured. Rigid second encapsulant is optional in this embodiment. The cathode electrical contact pad(s) and the anode electrical contact pad are not covered with encapsulant, and are available for surface mounting the LED lamp on a surface-mount circuit board. Other shapes and styles of receptacles are used in alternative embodiments. In particular, alternative embodiments use receptacles configured to accept several LEDs, such as those shown in FIGS. 12-14.

FIGS. 7A-7C show cross sections of portions of LED lamps to illustrate a manufacturing sequence according to an embodiment of the invention. In FIG. 7A, a receptacle 702 is filled with uncured elastomeric encapsulant material 704, such as silicone encapsulant material in a liquid or a gel state. An LED chip 708 has been die-attached to a substrate 706 that is part of a leadframe strip 710. A fixture 712 holds the receptacles during a curing step. Alternatively, empty receptacles are placed into the fixture 712, which are then filled with elastomeric encapsulant. A rim 714 supports the receptacle 702 in the fixture 712.

FIG. 7B shows the substrate 706 and LED chip 708 after it has been inserted into the fluid elastomeric encapsulant and is later cured. FIG. 7C shows a second encapsulant 716 dispensed over cured elastomeric encapsulant 704 and around leads 718, 720. The second encapsulant is then cured. After curing, the second encapsulant 716 is harder and stronger than the cured elastomeric encapsulant 704. The thickness of the second encapsulant material is merely exemplary. In a particular embodiment, the second encapsulant material is thicker than shown, and extends further toward the surface of the substrate, which enhances heat conduction and provides more support to the leads and substrate.

FIG. 8 is a cross section of an LED lamp 800 according to another embodiment of the invention. An LED chip 808 is a flip-chip LED with a silicon submount (not separately shown). Flip-chip LEDs are discussed further in U.S. Pat. Nos. 6,521,914 and 6,646,292. The LED chip 808 has both an anode bonding pad (not shown) and a cathode bonding pad (not shown) on the same side of the device. Wire bonds 816, 817 electrically connect the terminals of the LED chip 808 to the leads 412, 414.

Second encapsulant 818 is backfilled to substantially surround the substrate 406 up to near to the LED chip 808 to provide a shorter thermal path from the flip-chip LED to the secondary encapsulant 818. The thicker secondary encapsulant also provides a stronger and more rigid base for the substrate 406 and leads 412, 414. Other embodiments include a number of LED chips in a single LED package.

Figure 9:
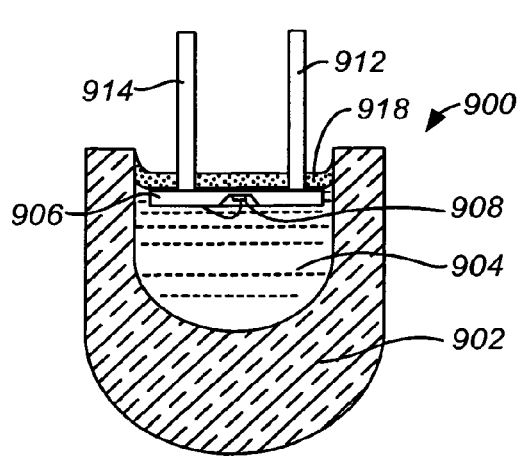
FIG. 9 shows a cross section of an LED lamp according to another embodiment of the invention.

FIG. 9 shows a cross section of an LED lamp 900 according to another embodiment of the invention. A substrate 906 is a PCB substrate with pins (leads) 912, 914 configured as leads according to a dual in-line package ("DIP") standard. This embodiment is especially desirable for through-hole mounting. Elastomeric encapsulant 904 inside a receptacle 902 covers an LED chip 908 and associated wire bond. Cured second encapsulant 918 is harder and more rigid than the elastomeric encapsulant 904 and provides a secure seal, securely fastens the substrate 906 within the receptacle 902, and further supports the pins 912, 914.

Figure 10:
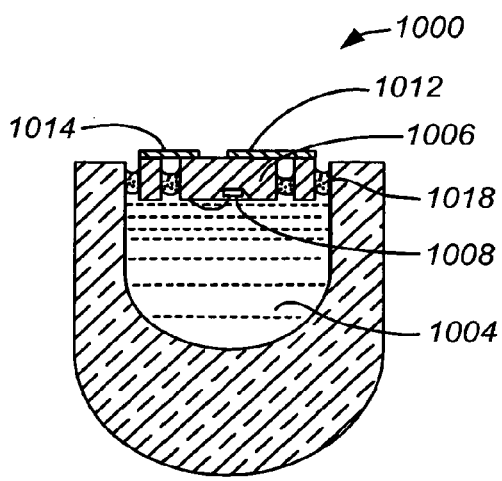
FIG. 10 shows a cross section of an LED lamp according to another embodiment of the invention.

FIG. 10 shows a cross section of an LED lamp 1000 according to another embodiment of the invention. A substrate 1006 is a PCB with backside terminals 1012, 1014 to form an LED component for surface mount technology ("SMT") applications. The substrate 1006 is sufficiently thick to allow positioning the substrate 1006 so that an LED chip 1008 mounted on one side of the substrate 1006 is encapsulated by elastomeric encapsulant 1004, while the backside terminals 1012, 1014 are exposed on the opposite side of the substrate 1006. LEDs suitable for SMT applications are further described in U.S. Pat. No. 6,806,583, entitled Light source, by Koay et al. The substrate 1006 is partially encapsulated by elastomeric encapsulant 1004 and partially encapsulated by a secondary encapsulant layer 1018, which has higher hardness, higher rigidity, and is more thermally conductive than the elastomeric encapsulant. Alternative embodiments use a ceramic substrate, such as alumina or aluminum nitride, with a reflector cup plated with a reflective material such as silver, nickel, gold or aluminum.

Figure 11A:
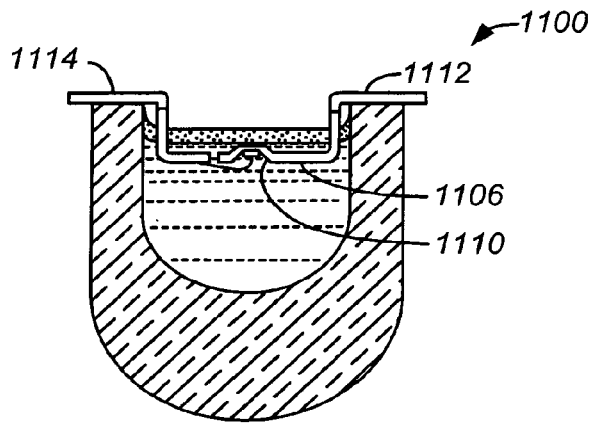
FIG. 11A shows a cross section of an LED lamp according to another embodiment of the invention.
Figure 11B:
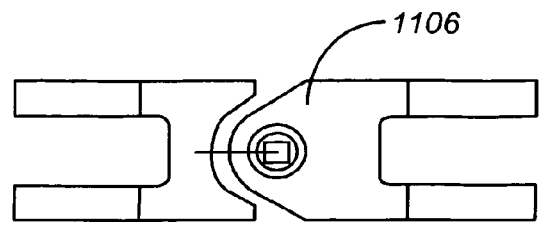
FIG. 11B is a plan view of the substrate of FIG. 11A.

FIG. 11A shows a cross section of an LED lamp 1100 according to another embodiment of the invention. A substrate 1106 is a "gull-wing" substrate. A "J-lead" substrate is similar to the gull-wing substrate in that it provides external leads for surface mounting of the LED lamp. The gull-wing substrate is a metal leadframe formed in a gull-wing SMT configuration. The metal leadframe may include a reflector cup 1110 formed on it and plated with a reflective surface. The substrate 1106 may be configured to have 2 or more leads 1112, 1114 for its electrical termination, and not limited to the example shown in FIG. 11A. In one aspect of implementation of the invention, the plating material forming the reflective surface of the reflector cup in the metal leadframe or the PCB may include, but not limited to, silver, nickel or gold. FIG. 11B is a plan view of the substrate of FIG. 11A.

Figure 12:
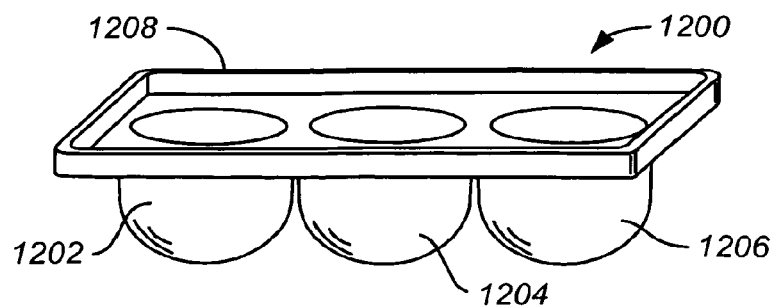
FIGS. 12-14 are isometric views of receptacles configured to accommodate more than one LED chip.
Figure 13:
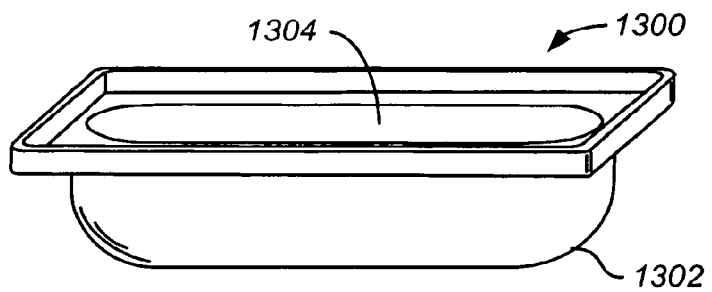
Figure 14:
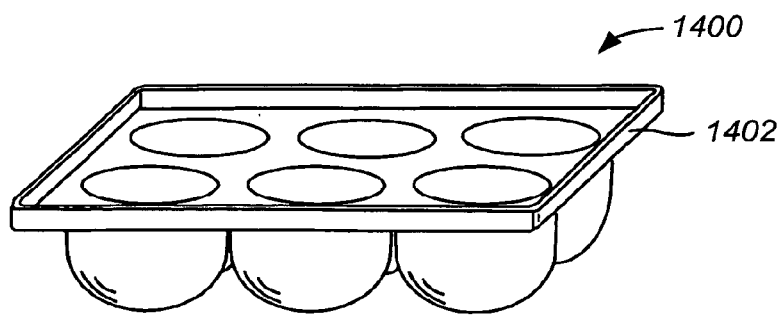

FIGS. 12-14 are isometric views of receptacles 1200, 1300, 1400 configured to accommodate more than one LED chip. Receptacle 1200 has three mold cups 1202, 1204, 1206 and a perimeter rim 1208 surrounding the three mold cups 1202, 1204, 1206. Elastomeric encapsulant is dispensed to fill the receptacle to a desired height. LEDs mounted on a substrate or substrates are inserted into the elastomeric encapsulant. In a particular embodiment, three LEDs are mounted on a single, rectangular substrate, which is inserted into the receptacle so that the LEDs transmit light into the mold cups, and are surrounded by elastomeric encapsulant. The rim 1208 aligns the substrate in the receptacle, which positions the LEDs in the mold cups.

FIG. 13 shows a receptacle 1300 having a single mold cup/lens 1302 into which elastomeric encapsulant is dispensed. A plurality of LED chips on a plurality of substrates, or a plurality of LED chips on a single substrate, are then inserted into the elastomeric encapsulant through the oval aperture 1304. FIG. 14 shows another receptacle 1400 having six mold cups/lenses and a perimeter rim 1402.

One or more LED chips may be attached to a substrate, and a substrate may have two or more electrical terminations. The shape of a receptacle and the number of lens outline may be configured to match the number of LEDs and the outline of the substrate on which the LEDs are disposed. The configurations shown in figures are representative of the shapes of transparent receptacles used, and the invention is not limited to these shapes.

Figure 15:
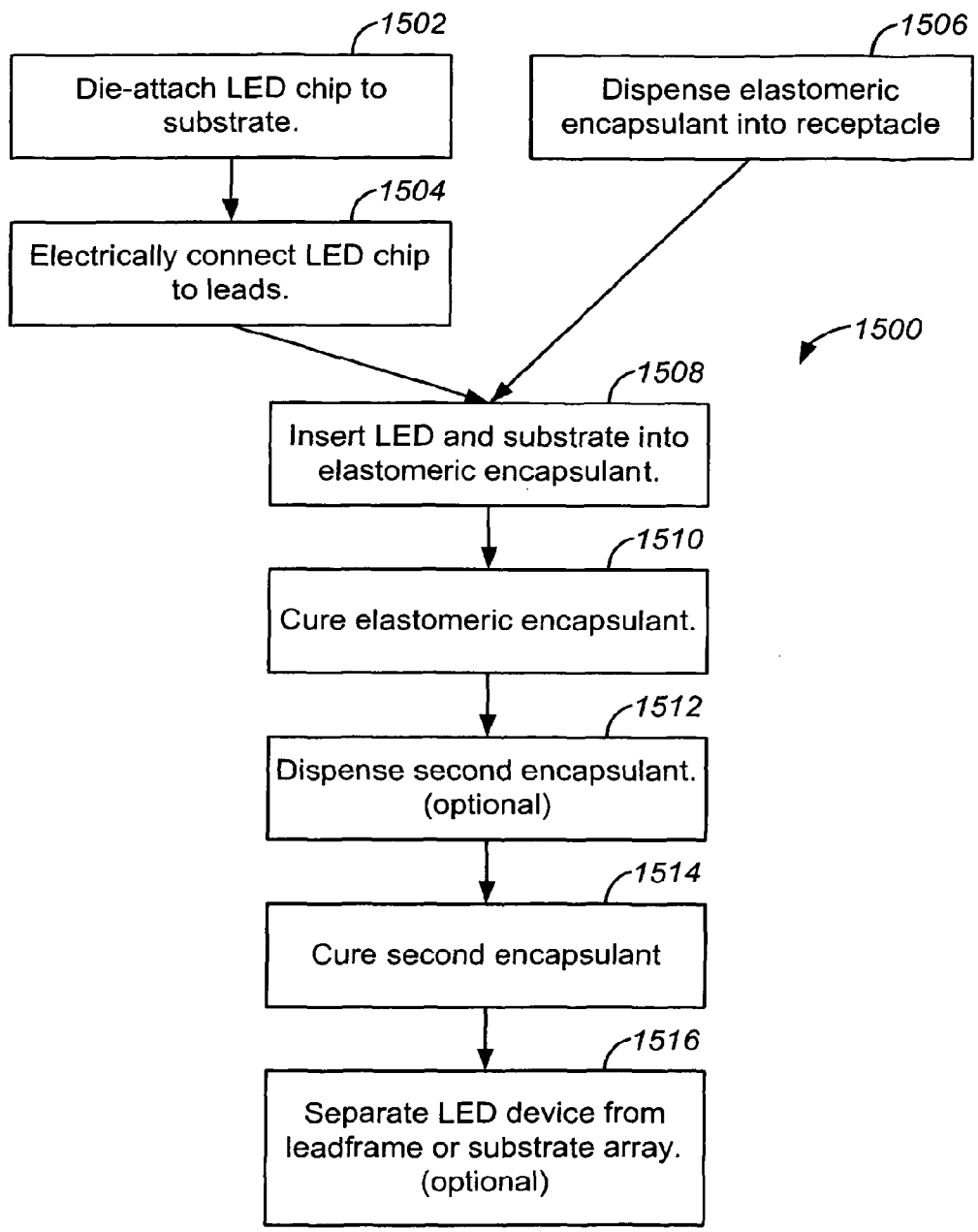
FIG. 15 is a flow chart of a method of manufacturing an LED device according to an embodiment of the invention.

FIG. 15 is a flow chart of a method of manufacturing an LED device 1500 according to an embodiment of the invention. An LED chip is die-attached to a substrate (step 1502) and is electrically connected to leads (step 1504). In one embodiment, the substrate is connected to a first terminal of the LED chip with a conductive die-attach technique, and is connected to a second terminal of the LED chip with a wire bond. In an alternative embodiment, a first wire bond couples a first terminal of the LED chip to a first lead (e.g. a substrate integrated with the first lead), and a second wire bond connects a second terminal of the LED chip to a second lead. In a particular embodiment, the first and second leads extend from a leadframe strip. In an alternative embodiment, the substrate is a PCB substrate or an array of PCB substrates that, when singulated, form individual LED devices. In a particular embodiment, a wavelength-converting layer of phosphor particles dispersed in a matrix (e.g. silicone, other elastomeric material, or sol gel) is disposed on the LED chip.

Uncured elastomeric encapsulant is dispensed into a receptacle (step 1506), and the LED chip and substrate are inserted into the uncured elastomeric encapsulant (step 1508). The elastomeric encapsulant is then cured (step 1510). In a particular embodiment, the entire LED device or LED leadframe strip, including any alignment fixtures, is cured in a conveyor-belt oven or alternatively a box oven.

The receptacle is made of a material, typically plastic, that is harder and more rigid than the cured elastomeric encapsulant material. In one embodiment, the LED chip is inserted into the uncured elastomeric encapsulant so as to surround the LED chip with uncured elastomeric encapsulant. Generally, the volume of the receptacle is known, and a selected amount of encapsulant is dispensed into the receptacle. The LED-substrate subassembly is inserted into the uncured elastomeric encapsulant to a selected depth so that the uncured elastomeric encapsulant fills the receptacle to a desired level.

In a particular embodiment, the LED chip, bond wire(s), substrate, and a portion of the leads are inserted into the uncured elastomeric encapsulant. In a particular embodiment, the LED chip lies within a reflector cup, and the method includes an optional step of pre-filling the reflector cup with uncured elastomeric encapsulant before the LED chip and substrate are inserted into the elastomeric encapsulant dispensed into the receptacle. Pre-filling the reflector cup avoids trapping gas that can form a bubble(s) near the LED chip, which can interfere with light emission from the LED device and thermal sinking of the LED chip.

In a further embodiment, a second encapsulant is dispensed into the receptacle over the elastomeric encapsulant (step 1512) and then cured (step 1514). In a particular embodiment, the cured second encapsulant is more rigid than the elastomeric encapsulant and surrounds and secures the leads. In some embodiments, the second encapsulant provides a second seal across the aperture that is stronger and more durable than a first seal provided by the elastomeric encapsulant. In a yet further embodiment, the leads are cut to singulate the LED device from a leadframe strip (step 1516), or alternatively, an LED device having a PCB substrate is singulated from an array of PCB substrates.

The combination of a hard outer receptacle and inner elastomeric material provides several advantages over conventional LED lamps. Referring to FIG. 1A, if an epoxy is used for the encapsulant 116, stresses resulting from curing can damage the wire bond. Thermal stress also arises from differences in the thermal coefficient of expansion between the epoxy and the substrate during thermal shock, such as during a solder re-flow process. Excessive stress can lift or crack the LED chip as the lamp is heated or cooled. The elastomeric encapsulant provides lower stress in the package and better reliability and yields after thermal shock, such as solder re-flow. Similarly, the elastomeric encapsulant avoids degradation of light output (yellowing), particularly with medium- to low-powered LED chips (i.e. less than 500 mW) emitting light having short wavelength (i.e. less than 570 nm) LED chips. The receptacle provides rigidity and wear resistance for the elastomeric encapsulant. However, embodiments are also suitable for use with LED devices emitting wavelengths greater than 570 nm at power greater than 500 mW. Embodiments of the invention are easily adaptable to leadframe LED manufacturing techniques, providing simple construction with few piece-parts and ease of manufacturing in high volume production While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A light-emitting device, comprising:
   a Printed Circuit Board (PCB) substrate;
   an LED chip having a first terminal and a second terminal attached to the PCB substrate;
   a receptacle having an aperture, the LED chip and at least a portion of the PCB substrate being inserted into the receptacle through the aperture;
   elastomeric encapsulant within the receptacle surrounding the LED chip and the at least a portion of the PCB substrate that is inserted into the receptacle through the aperture; and
   rigid encapsulant disposed within the aperture of the receptacle on the elastomeric encapsulant.

2. The light-emitting device of claim 1 wherein the elastomeric encapsulant comprises silicone encapsulant.

3. The light-emitting device of claim 1 wherein the PCB substrate comprises a first backside terminal that is electrically coupled to the first terminal of the LED with a bond wire.

4. The light-emitting device of claim 3 wherein the PCB substrate further comprises a second backside terminal that is electrically coupled to the second terminal of the LED.

5. The light-emitting device of claim 1 wherein the LED chip includes a wavelength-converting overlay.

6. The light-emitting device of claim 5 wherein the wavelength-converting overlay comprises wavelength-converting particles dispersed in an elastomeric matrix.

7. The light-emitting device of claim 5 wherein the wavelength-converting overlay comprises phosphor particles dispersed in a silicone matrix.

8. The light-emitting device of claim 1 wherein the LED chip emits light having a wavelength between 200 nm and 570 nm.

9. The light-emitting device of claim 1 wherein the rigid encapsulant comprises a rigid polymer with a Shore Hardness greater than D70.

10. The light-emitting device of claim 1 wherein the rigid encapsulant comprises a thermally conductive filler dispersed in a rigid polymer.

11. The light-emitting device of claim 1 wherein the rigid encapsulant has a thermal conductivity greater than 0.5 W/m0K.

12. The light-emitting device of claim 1 wherein the PCB substrate is partially encapsulated by the elastomeric encapsulant and partially encapsulated by the rigid encapsulant.

13. The light-emitting device of claim 1 wherein the PCB substrate is configured for Surface Mount Technology (SMT) applications.

14. The light-emitting device of claim 1 wherein the PCB substrate comprises a first side and an opposing second side with a first and second backside terminal disposed thereon, wherein the LED chip is mounted on the first side of the PCB substrate and completely encapsulated by the elastomeric encapsulant while the second side of the PCB substrate is not covered by either the elastomeric encapsulant or the rigid encapsulant thereby exposing the first and second backside terminals.

15. The light-emitting device of claim 14 wherein the rigid encapsulant partially encapsulates the PCB substrate so as to seal the elastomeric encapsulant within the receptacle while allowing electrical connections to be made to the first backside terminal and to the second backside terminal.

16. The light-emitting device of claim 1 wherein the PCB substrate comprises a reflector cup.

17. The light-emitting device of claim 1 further comprising a plurality of LED chips wherein the receptacle has a plurality of mold cups, at least one LED chip emitting light into each of the plurality of mold cups, the elastomeric encapsulant surrounding each of the LED chips.

18. The light-emitting device of claim 1 wherein the elastomeric encapsulant has a first index of refraction and forms a primary lens and the receptacle has a second index of refraction and forms a secondary lens, the first index of refraction being selected to be greater than the second index of refraction.

19. The light-emitting device of claim 16 wherein the LED chip is mounted in the reflector cup.

20. The light-emitting device of claim 19, wherein the reflector cup comprises a reflective surface comprising at least one of silver, nickel, and gold.

* * * * *